United States Patent
Mische et al.

(10) Patent No.: US 9,824,953 B1
(45) Date of Patent: Nov. 21, 2017

(54) MOUNTING AND ENVIRONMENTAL PROTECTION DEVICE FOR AN IGBT MODULE

(71) Applicant: Caterpillar Inc., Peoria, IL (US)

(72) Inventors: William Mische, Chillicothe, IL (US); Eric Andris, Dunlap, IL (US); Basheer Qattum, Peoria, IL (US); Daniel Sergison, East Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 15/156,169

(22) Filed: May 16, 2016

(51) Int. Cl.
*H01L 23/367* (2006.01)
*H01L 29/739* (2006.01)
*H01L 23/40* (2006.01)
*H01L 25/07* (2006.01)
*H02M 1/08* (2006.01)
*H05K 5/03* (2006.01)

(52) U.S. Cl.
CPC ...... *H01L 23/3675* (2013.01); *H01L 23/4006* (2013.01); *H01L 25/072* (2013.01); *H01L 29/7393* (2013.01); *H02M 1/08* (2013.01); *H05K 5/03* (2013.01); *H01L 2023/4087* (2013.01)

(58) Field of Classification Search
CPC ............. H01L 23/3675; H01L 23/4006; H01L 25/072; H01L 2023/4087; H02M 1/08; H05K 5/03
See application file for complete search history.

(56) References Cited

U.S. PATENT DOCUMENTS

| | | | |
|---|---|---|---|
| 5,877,093 A * | 3/1999 | Heffner | H01L 21/56 257/E21.502 |
| 8,300,413 B2 | 10/2012 | Chen | |
| 8,867,211 B2 | 10/2014 | Wiltzius | |
| 8,885,344 B2 | 11/2014 | Asakura et al. | |
| 8,897,010 B2 | 11/2014 | Shepard | |
| 9,111,900 B2 | 8/2015 | Bogen et al. | |
| 2014/0285973 A1 | 9/2014 | Hong et al. | |
| 2015/0296661 A1 | 10/2015 | Mari Curbelo et al. | |
| 2015/0327395 A1 | 11/2015 | Spencer et al. | |

* cited by examiner

*Primary Examiner* — David Vu
(74) *Attorney, Agent, or Firm* — Miller, Matthias & Hull LLP; James S. Bennin

(57) ABSTRACT

A semiconductor module is disclosed. The semiconductor module may include a housing having a sidewall portion, a housing support plate coupled to a bottom surface of the sidewall portion such that the housing support plate and the sidewall portion define an interior space of the housing of the semiconductor module, and a semiconductor device disposed within the interior space and fixedly coupled to the housing. The semiconductor module may further include a cover member fixedly attached to a top surface of the sidewall portion such that the cover member, the housing and the housing support plate form a protective enclosure for the semiconductor device.

19 Claims, 6 Drawing Sheets

US 9,824,953 B1

MOUNTING AND ENVIRONMENTAL PROTECTION DEVICE FOR AN IGBT MODULE

FIELD OF THE DISCLOSURE

The present disclosure relates generally to an electronic module and, more particularly, to a mounting and protective module for a semiconductor device.

BACKGROUND OF THE DISCLOSURE

Power systems are incorporated into a host of machines and equipment, such as but not limited to, hauling machines, dump trucks, mining vehicles, on-highway vehicles, trains, motor graders, loaders, excavators, earth-moving vehicles, dozers, tractors, backhoes, agricultural equipment, material handling equipment, power generators, and the like. The power systems may be configured to distribute and control the electric power loads utilized by the machine or equipment while in operation and performing one or more tasks. Moreover, the power systems may use electrical storage devices such as capacitors and batteries, to supply the power needed and electrical switching devices, such as diodes and transistors, to direct and distribute the power to where it is needed.

The machines and equipment which rely on such electrical storage and switching devices may be used in harsh environments where they are exposed to extreme temperature, mechanical shock, vibrations, moisture, dust, dirt, and other such conditions. Furthermore, the electrical storage and switching devices may be relied upon to keep the machines and equipment operational. As a result, a protective package or enclosure module may be used to protect the electrical storage and switching devices from the harsh operating conditions. However, some of the protective features incorporated into the packaging modules may make service and repair of the electrical power systems more difficult. The increased downtime during service and repair of the machine or equipment may impact the time and cost it takes to complete the specified job or task. Additionally, existing packaging methods may not be scalable for particular application needs, which may lead to unnecessary product cost, weight, and size, or require additional product development costs to achieve a lean solution. Accordingly, a need exists for improved protective packaging modules for electrical storage and switching devices.

An electronic device clamped to a heat sink is disclosed in U.S. Patent Application No. 20150327395A1 (hereinafter the "'395 application"), entitled, "Apparatus for Securing an Electronic Component." The device of the '395 application includes an electronic component operably coupled to the heat sink. The electronic device includes an insulative housing including a body portion and a pair of opposed depending legs. The body portion further includes a recess formed to receive a pivot block and a load bar engageable with the pivot block. Fasteners are positioned through the load bar and interiorly travel through the entire housing for attaching the electric device to a heat sink such that the load bar presses on the pivot block, the pivot block presses on the body portion, and the body portion clamps the electric component to the heat sink. However, the electronic device of the '395 application does not provide an electronic device housing which may reduce the downtime during service. Furthermore, the electronic device of the '395 application is not scalable for particular application needs.

SUMMARY OF THE DISCLOSURE

In accordance with one embodiment, a semiconductor module is disclosed. The semiconductor module may include a housing having a sidewall portion, a housing support plate coupled to a bottom surface of the sidewall portion such that the housing support plate and the sidewall portion define an interior space of the housing of the semiconductor module, and a semiconductor device disposed within the interior space and fixedly coupled to the housing. The semiconductor module may further include a cover member which is fixedly attached to a top surface of the sidewall portion such that the cover member, the housing, and the housing support plate form a protective enclosure for the semiconductor device.

In accordance with another embodiment, a power converter system is disclosed. The power converter system may include a plurality of semiconductor modules, and each semiconductor module, of the plurality of semiconductor modules, may include a housing and a semiconductor device. Moreover, the housing, of each semiconductor module of the plurality of semiconductor modules, may have a sidewall portion which includes a top surface and a bottom surface. The power converter system may further include a semiconductor module heat sink having a plurality of module mounting locations which are arranged on a top surface of the semiconductor module heat sink. Each semiconductor module, of the plurality of semiconductor modules, may be positioned at one of the plurality of module mounting locations and coupled to the semiconductor module heat sink along the bottom surface of the sidewall portion. The sidewall portion of each semiconductor module of the plurality of semiconductor modules, and the top surface of the semiconductor module heat sink defining an interior space of each semiconductor module of the plurality of semiconductor modules. The power converter system may further include a plurality of attachment structures integrated with the sidewall portion of each semiconductor module, of the plurality of semiconductor modules, and adapted to secure the semiconductor device, of each semiconductor module, within the interior space of the semiconductor module. A cover member may be attached to the top surface of the sidewall portion, of the semiconductor module, such that the cover member, the housing of the semiconductor module, and the semiconductor module heat sink form a protective enclosure for the semiconductor device of the semiconductor module.

In accordance with yet another embodiment, a power converter system is disclosed. The power system may include a plurality of semiconductor modules and each semiconductor module, of the plurality of semiconductor modules, may include a housing, a semiconductor device, and a cover member. The housing, of each semiconductor module of the plurality of semiconductor modules, may include a sidewall portion having a top surface and a bottom surface. The power converter system may further include a semiconductor module heat sink having a plurality of module mounting locations and a plurality of auxiliary mounting locations arranged on a top surface of the semiconductor module heat sink. The bottom surface of the sidewall portion, of each semiconductor module of the plurality of semiconductor modules, may be positioned at one of the plurality of module mounting locations of the semiconductor module heat sink. The top surface of the semiconductor module heat sink and the sidewall portion of each semiconductor module of the plurality of semiconductor modules, may define an interior space of each semiconductor module of the plurality of semiconductor modules. Moreover, a plurality of attachment structures may be integrated with the sidewall portion of each semiconductor module of the plurality of semiconductor modules. The plurality of attachment structures of each semiconductor module may include a first set of attachment holes and the semiconductor device, of each semiconductor module, may include a second set of attachment holes. The first set of attachment holes may align with the second set of attachment holes such that a pressure fastening device may be inserted into each of the first set of attachment holes and the second set of attachment holes. The pressure fastening device may exert a pressure on the semiconductor device such that a bottom surface of the semiconductor device maintains contact with the top surface of the semiconductor module heat sink and the semiconductor device, of each semiconductor module, is secured between the plurality of attachment structures and the top surface of the semiconductor module heat sink.

The power converter system may further include a first set of holes being formed in the cover member, of each of the plurality of semiconductor modules, such that the first set of holes extend from a top surface of the cover member to a bottom surface of the cover member. A second set of holes may be formed in the housing, of each of the plurality of semiconductor modules, such that the second set of holes extend from a top surface of the sidewall portion to a bottom surface of the sidewall portion. The power converter system may further include a third set of holes formed in a top surface of the semiconductor module heat sink, and the third set of holes may be arranged around each of the plurality of module mounting locations. The first set of holes, the second set of holes, and the third set of holes may be aligned such that a first fastening device inserted into each of the aligned first set of holes, second set of holes, and third set of holes fixedly attaches the cover member, the housing, and the semiconductor module heat sink together.

The power system may be further configured to include a first sealing element being disposed between the bottom surface of the cover member and the top surface of the sidewall portion, of each semiconductor module, thereby forming a first seal between the cover member and the sidewall portion of each semiconductor module. Moreover, a second sealing element may be disposed between the bottom surface of the sidewall portion of each semiconductor module and the top surface of the semiconductor module heat sink thereby forming a second seal between the housing, of each semiconductor module, and the semiconductor module heat sink. Furthermore, the semiconductor module heat sink may include an internal channel formed within the semiconductor module heat sink and the internal channel may be configured to run along a length of the semiconductor module heat sink. Each of the plurality of module mounting locations may each have a module aperture contained within a sealing element groove that is formed around the periphery of each of the plurality of module mounting locations. The plurality of auxiliary mounting locations may each have an auxiliary aperture, and each of the module apertures and the auxiliary apertures may extend through the top surface of the semiconductor module heat sink and into the internal channel. The internal channel may be configured with a conductor and the plurality of semiconductor modules may have an input/output connection and the plurality of semiconductor modules may be coupled to the conductor through the input/output connection by extending into the internal channel through each of the module apertures.

These and other aspects and features will be more readily understood when reading the following detailed description in conjunction with the accompanying drawings.

While the present disclosure is susceptible to various modifications and alternative constructions, certain illustrative embodiments thereof will be shown and described below in detail. The disclosure is not limited to the specific embodiments disclosed, but instead includes all modifications, alternative constructions, and equivalents thereof.

DETAILED DESCRIPTION

Figure 1:
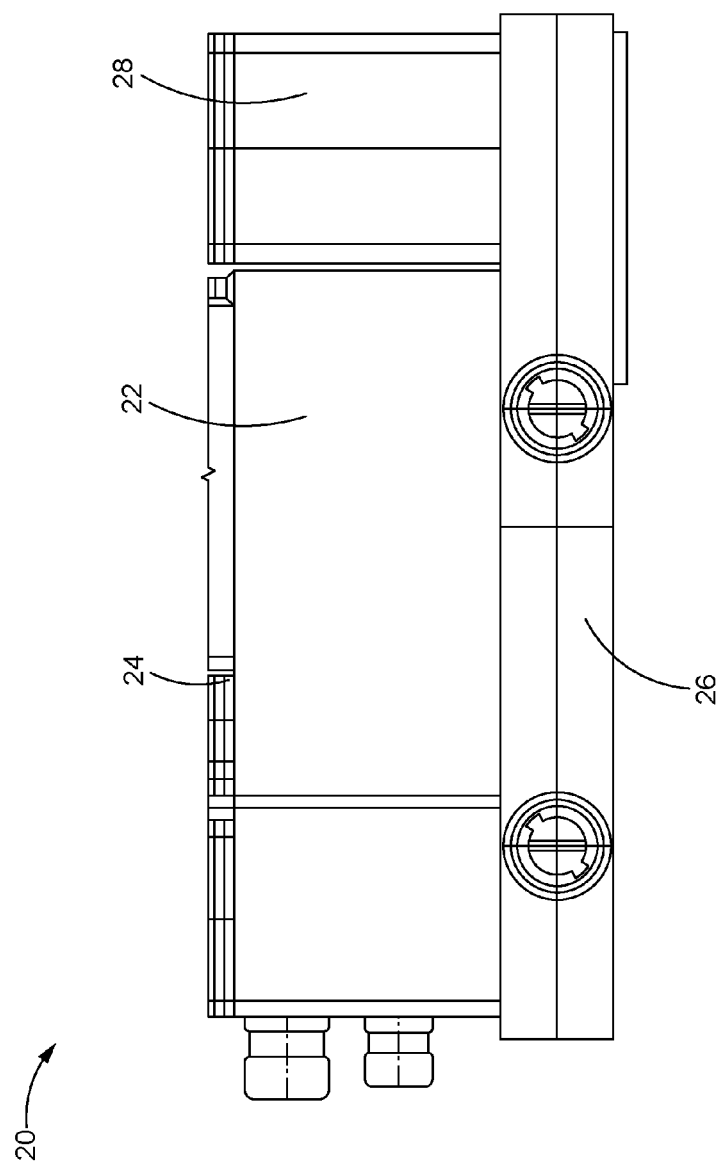
FIG. 1 is a side view of a semiconductor module, in accordance with one embodiment of the present disclosure.

Referring now to the drawings, and with specific reference to FIG. 1, a semiconductor module 20 is shown in accordance with one embodiment of the present disclosure. In one non-limiting example, the semiconductor module 20 may be configured to include a housing 22, and a cover member 24, and the housing 22 may be coupled to a housing support plate 26. Moreover, in some embodiments, the housing support plate 26 may be configured to provide support to both the semiconductor module 20 and one or more auxiliary components 28. Additionally, the housing support plate 26 may serve as a heat sink or other temperature regulation component. In one non-limiting example, the housing support plate 26 absorbs or otherwise captures heat that is generated by the semiconductor module 20 and this capture of heat may help maintain a specified temperature range of the semiconductor module 20, such as but not limited to −40° C. to +150° C. The auxiliary component 28 may be a capacitor, a resistor, a power export device or other known component and the auxiliary component 28 may be configured to provide electrical noise filtration, priming power supply, indicator lamp drivers, ground fault detection, and other such functions of the semiconductor module 20.

Figure 2:
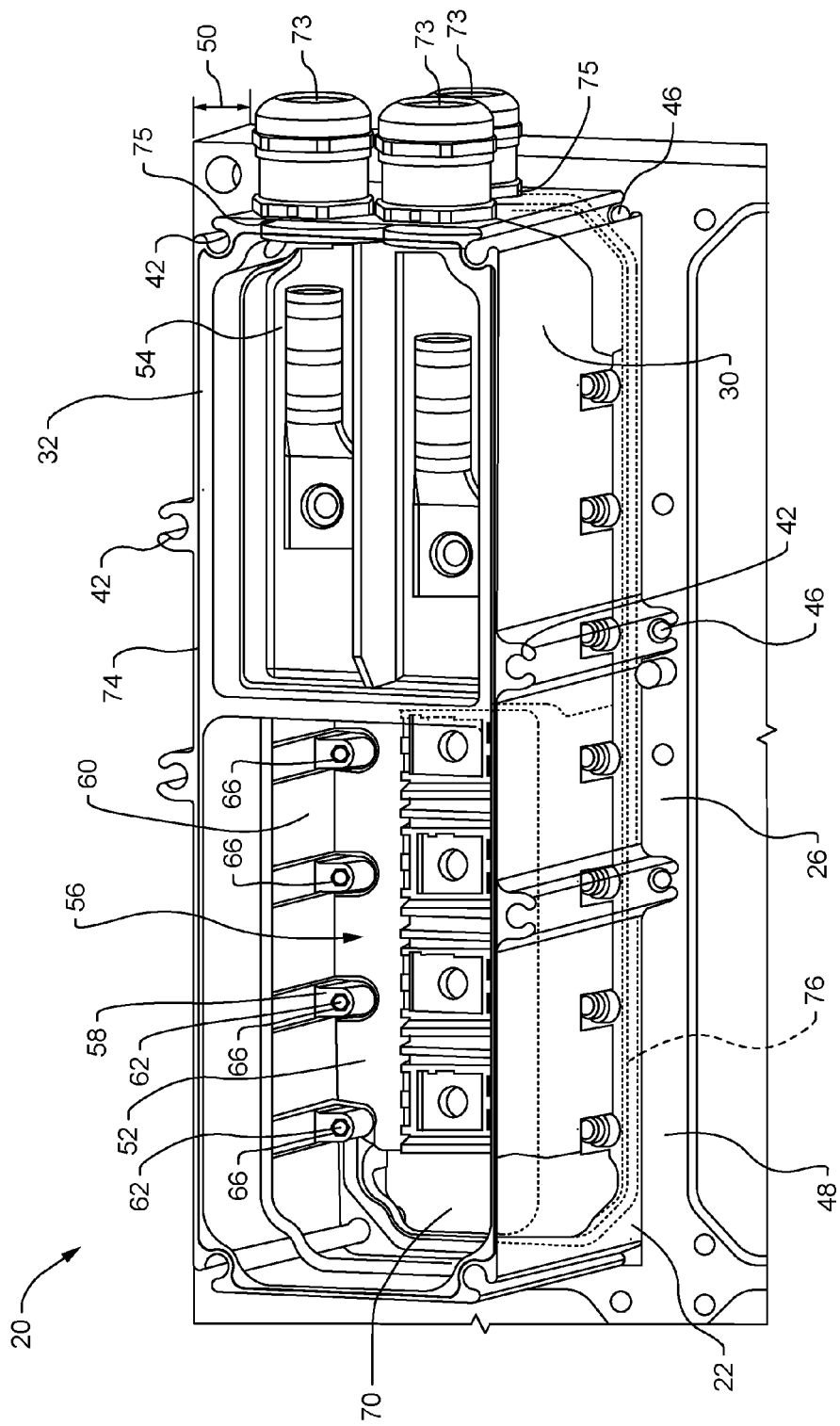
FIG. 2 is a perspective view of a semiconductor module with the cover member removed, in accordance with one embodiment of the present disclosure.
Figure 3:
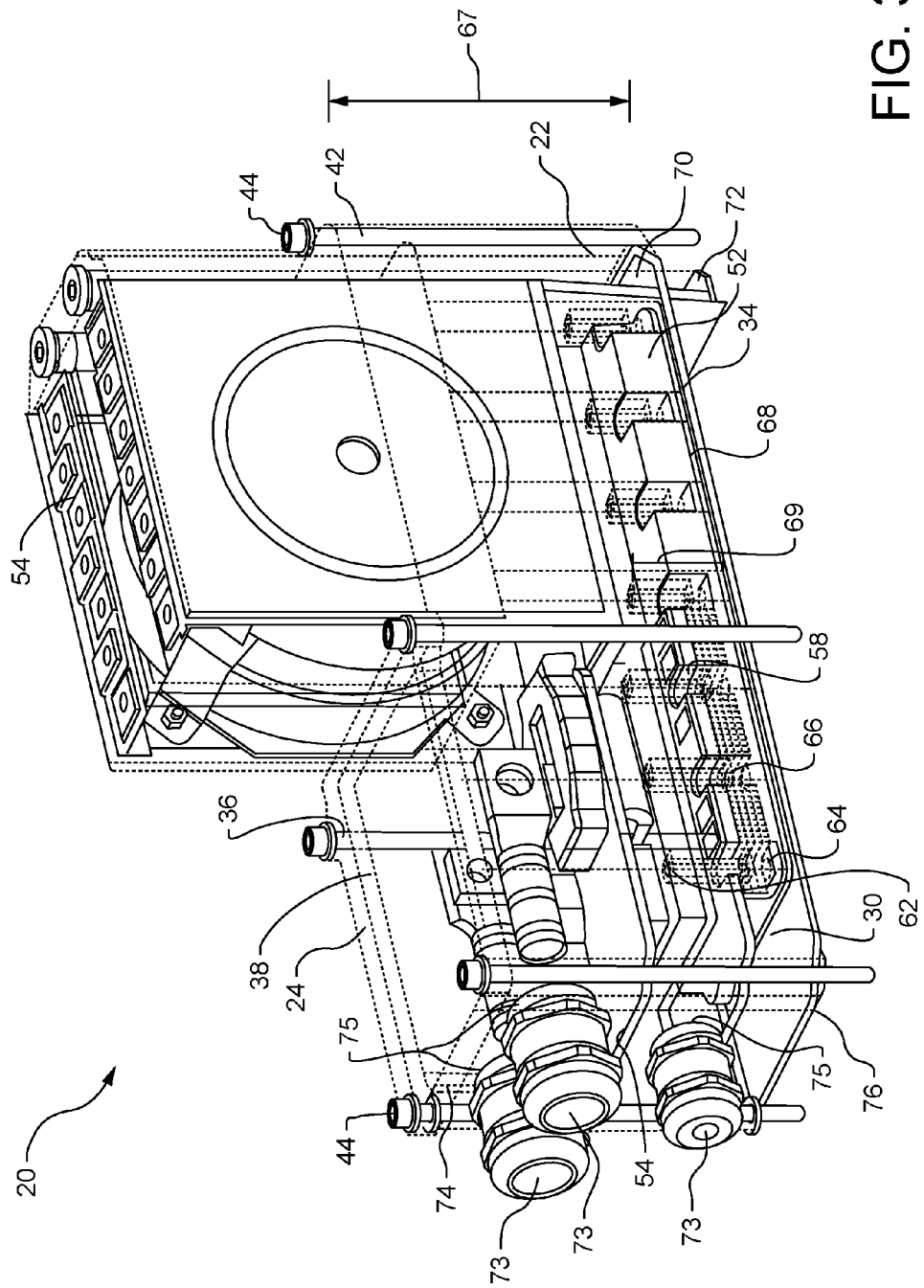
FIG. 3 is a perspective view of a semiconductor module, in accordance with one embodiment of the present disclosure.

Referring now to FIG. 2-3, a non-limiting example of the semiconductor module 20 is shown in accordance with the present disclosure. In some embodiments, the housing 22 of the semiconductor module 20 may be configured to include a sidewall portion 30, which includes a top surface 32, and a bottom surface 34 and the housing 22 may be formed from aluminum alloy, titanium alloy, composite, or other suitable material. Furthermore, the cover member 24 may be positioned on the top surface 32 of the sidewall portion 30 and fixedly attached to the housing 22. In one non-limiting example, the cover member 24 may include a set of first holes 36 which extend through the cover member 24 from a top surface 38 to a bottom surface 40 of the cover member 24. Furthermore, the housing 22 may include a second set of holes 42 formed in the sidewall portion 30 which extend from the top surface 32 to the bottom surface 34 of the sidewall portion 30 of the housing 22. In some embodiments, the cover member 24 may be placed on the top surface 32 of the sidewall portion 30 such that the first set of holes 36 in the cover member 24 align with the second set of holes 42 in the sidewall portion 30, and a fastening device 44, such as but not limited to, a screw, bolt, pin, or other such faster may be inserted into each of the aligned first and second sets of holes 36, 42. Furthermore, the fastening device 44 inserted into each of the first and second set of holes 36, 42 may fixedly attach the cover member 24 to the top surface 32 of the housing 22.

In some embodiments, the semiconductor module 20 may be configured as a protective enclosure or package which may be formed by positioning the housing 22 on the housing support plate 26 such that the first set of holes 36 in the cover member 24 and the second set of holes 42 in the sidewall portion 30 align with a third set of holes 46 that are formed in a top surface 48 of the housing support plate 26. The third set of holes 46 may be configured such that they extend through a portion of the housing support plate thickness 50. Alternatively, the third set of holes 46 may be configured such that they extend through the entire housing support plate thickness 50, or any other such configuration. Moreover, the semiconductor module 20 may be arranged such that the housing 22, the housing support plate 26, and the cover member 24 are in alignment and one or more of the first fastening devices 44 may be inserted into the first, second and third set of holes 36, 42, 46, thereby fixedly attaching the cover member 24, the housing 22 and the housing support plate 26 to one another.

The first fastening devices 44 utilized to fixedly attach the cover member 24, the housing 22, and the housing support plate 26 together may be screws, bolts, pins, or other such fasteners, and the first, second and third set of holes 36, 42, 46 may be adapted and aligned to receive and secure the first fastening devices 44. In one non-limiting example, at least one of the first, second or third set of holes 36, 42, 46 is formed with a securing mechanism, such as but not limited to threads, and the securing mechanism may be complementary to the first fastening devices 44 such that the first fastening devices 44 may be tightened, fastened, interlocked, or otherwise secured. Furthermore, the first, second, and third set of holes 36, 42, 46, may be aligned such that the first fastening devices 44 can be inserted into each of the aligned first, second and third set of holes 36, 42, 46. In some embodiments, each of the first fastening devices 44 may be at least partially threaded. Moreover, the first, second, and third set of holes 36,42, 46 may include a complementary set of threads, and the first fastening devices 44 are able to be tightened such that the cover member 24, the housing 22 and the housing support plate 26 are fixedly attached to one another. As a result, the semiconductor module 20 may form a protective enclosure that is capable of providing protection against vibration, moisture, light, particles, and/or other such elements or environmental conditions.

As further illustrated in FIGS. 2-3, the protective enclosure formed by the semiconductor module 20 may be configured to secure and protect a semiconductor device 52, such as, but not limited to, a field-effect transistor (FET), a metal-oxide-semiconductor field-effect transistor (MOSFET), an insulated-gate bipolar transistor (IGBT) or other known semiconductor device. Additionally, the semiconductor module 20 may be configured to contain one or more semiconductor module components 54 such a capacitor, a sensor, a connector, a printed circuit board (PCB) or other such component. In some embodiments, the housing 22 defines an interior space 56 which may be configured to accommodate the semiconductor device 52 and one or more semiconductor module components 54, such as but not limited to, bulk capacitance, filter, auxiliary converter, energy storage elements, or other electrically functional element that may be part of a power conversion system. The interior space 56 of the housing 22 may have one or more attachment structures 58 which are integrated with the sidewall portion 30 of the housing 22 and the one or more attachment structures 58 may be capable of securing and positioning the semiconductor device 52 and the additional semiconductor module components 54 within the interior space 56 of the housing 22. In some embodiments, the one or more attachment structures 58 may be a plurality of tabs, a recess, a lip, a compression fitting, or other suitable type of structure.

Figure 4:
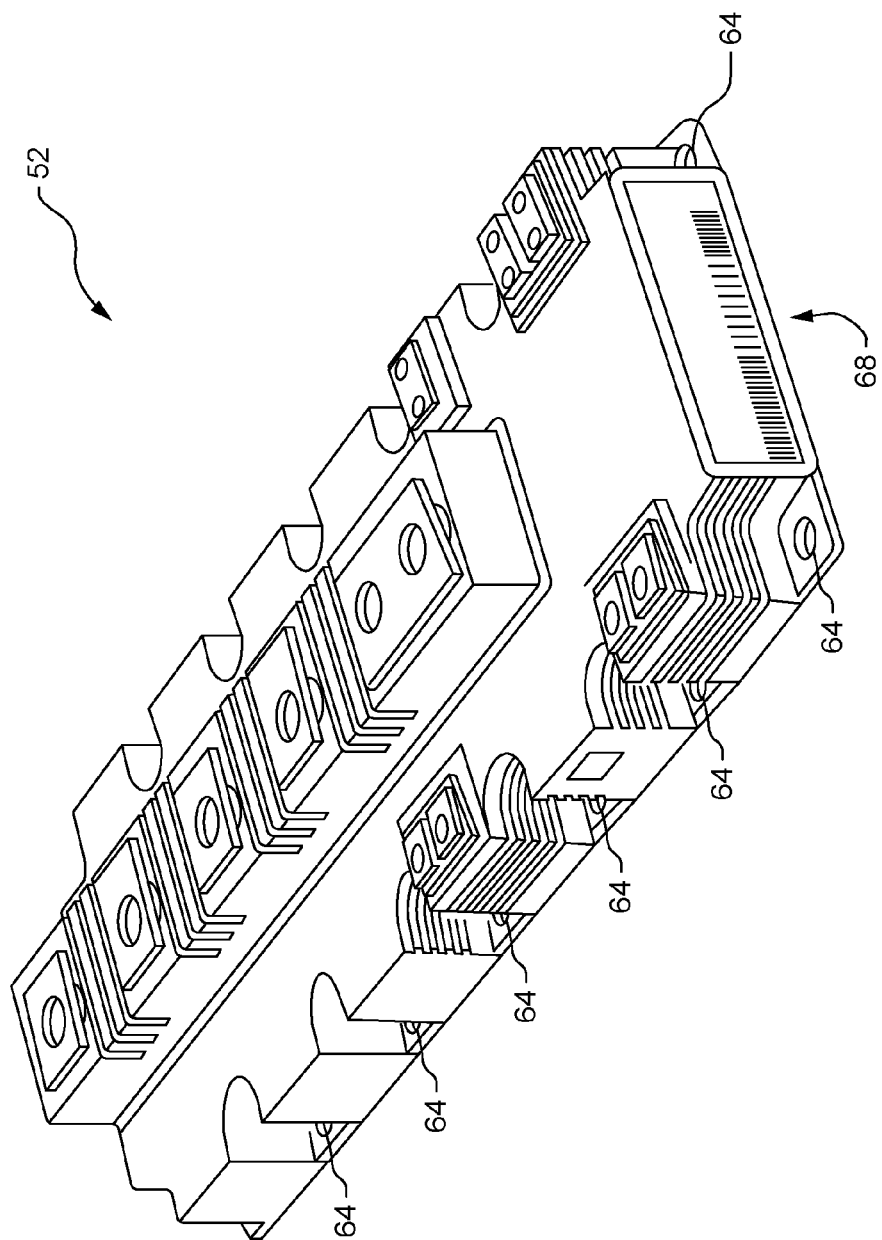
FIG. 4 is a perspective view of a semiconductor device incorporated into the semiconductor module of FIG. 1, in accordance with one embodiment of the present disclosure.

In one non-limiting example, the one or more attachment structures 58 may be arranged along an interior surface 60 of the sidewall portion 30 and the one or more attachment structures 58 are configured to include a set of first attachment holes 62. Additionally, as shown in FIG. 4, with continued reference to FIGS. 2 and 3, the semiconductor device 52 may include a second set of attachment holes 64. The first set of attachment holes 62 may be formed in the one or more attachment structures 58 such that they align with the second set of attachment holes 64 in the semiconductor device 52. In some embodiments, a second fastening device 66 may be inserted into each of the first and second set of attachment holes 62, 64 to fixedly attach the semiconductor device 52 to the one or more attachment structures 58 of the housing 22. In one non-limiting example, the second fastening device 66 may be a screw, a bolt, a pin or other such fastener. Moreover, the second fastening devices 66 may be sized such that they do not need to extend the entire height 67 of the housing 22. For example, the second fastening device 66 may be sized according to a height 69, and the height 69 may be comprised of the first set of attachment holes 62 in the one or more attachment structures 58 plus the second set of attachment holes 64 in the semiconductor device 52. As a result, the second fastening device 66 may be sized such that each of the second fastening device 66 do not thread into the top surface 38 of the housing support plate 26. In one non-limiting example, the housing 22 may be fixedly attached to the housing support plate 26 using one or more of the first fastening devices 44, and the one or more attachment structures 58 along with the second fastening devices 66 securely position the semiconductor device 52 between the one or more attachment structures 58 and a top surface 48 of the housing support plate 26.

In some embodiments, the one or more attachment structures 58 and the second fastening devices 66 may position the semiconductor device 52 such that a bottom surface 68 of the semiconductor device 52 is positioned adjacent to the top surface 48 of the housing support plate 26. Moreover, in one non-limiting example the second fastening device 66 may be a pressure fastening device, or compression mechanism, such as but not limited to a spring washer or other pressure fastening device. Furthermore, the second fastening device 66 may be used to provide a constant pressure (e.g. as a pressure fastening device) or other such securing force, that may be exerted on the semiconductor device 52 to place the semiconductor device 52 in direct contact with the housing support plate 26. As a result of the pressure or compression force provided by the second fastening device 66, a large portion, such as but not limited to more than 50% of the surface area of the semiconductor device 52 bottom surface 68, may be in mechanical contact with the housing support plate 26. In one non-limiting example, the second fastening device 66, being a pressure fastening device exerts a pressure on the semiconductor device 52 such that the bottom surface 68 of the semiconductor device 52 maintains contact with the top surface 48 of the housing support plate 26. In some cases, the semiconductor device 52 may be susceptible to vibration and other mechanical forces which may damage and/or cause failure of the semiconductor device 52. Ensuring good contact between the semiconductor device 52 bottom surface 68 and the housing support plate 26 may provide the structural support to adequately isolate the semiconductor device 52 from such vibration and other mechanical forces. Additionally, in some embodiments, the semiconductor device 52 may generate thermal energy or heat while in use and the housing support plate 26 may be configured to collect heat that is generated by the semiconductor device 52. As a result, good contact between the semiconductor device 52 and the housing support plate 26 may help maintain the temperature of the interior space 56 within a specified semiconductor device 52 operating range, such as but not limited to between −40° C. and +150° C.

As further illustrated by FIGS. 2-3, the housing support plate 26 may include a housing support plate aperture 70 formed in the top surface 48 of the housing support plate 26. In some embodiments, the housing support plate aperture 70 may provide access for a conductor, a communication pathway, or other such connection, to pass in and out of the semiconductor module 20. For example, a first semiconductor module input/output connection 72 may be connected to the semiconductor device 52 and semiconductor module components 54, and the first semiconductor module input/output connection 72 may be configured to pass through the housing support plate aperture 70. Additionally, or alternatively, one or more second semiconductor module input/output connections 73 may be formed through one or more housing apertures 75, or sidewall apertures, that are formed in the sidewall portion 30 or other location of the housing 22. As a result, the first and second semiconductor module input/output connections 72, 73 may provide one or more pathways which allow electrical signals, optical signals, electrical supply power, control signals, data signals, or any other type of input/output associated with the semiconductor device 52 and/or semiconductor module components 54 to be transported in and/or out of the semiconductor module 20. As such, the one or more housing apertures 75, or sidewall apertures, may extend from the interior space 56 of the housing 22 to the exterior of the housing 22 and the first semiconductor module input/output connection 72, and the one or more second semiconductor module input/output connections 73 may extend through the one or more housing apertures 75.

In some embodiments, the semiconductor module 20 may be configured to provide environmental protection to the semiconductor device 52 and semiconductor module components 54 which are contained within the semiconductor module 20. For example, in some applications, the semiconductor module 20 may have the capability to protect against moisture, temperature, dust, conductive particles, and/or other environmental contaminants and conditions that may impact the operation and reliability of the semiconductor module 20 and semiconductor module components 54. As illustrated in FIGS. 2 and 3, the semiconductor module 20 may incorporate a first sealing element 74 which is disposed between the cover member 24 of the semiconductor module 20, and the top surface 32 of the sidewall portion 30 of the housing 22. Additionally, or alternatively, a second sealing element 76 may be disposed between the bottom surface 34 of the sidewall portion 30, and the top surface 48 of the housing support plate 26. In some embodiments, the first sealing element 74 and the second sealing element 76 may be an o-ring, a press-in-place (PIP) seal, a silicon gasket, or other known type of sealing element. Furthermore, the one or more housing apertures 75 may incorporate a housing aperture sealing element (not shown) with the second semiconductor module input/output connections 73 in order to protect contaminants, such as moisture, dust conductive particles, and other contaminants, from entering the one or more housing apertures 75.

Furthermore, the first sealing element 74 may be disposed between, and be sealingly engaged with, the cover member 24 of the semiconductor module 20 and the top surface 32 of the sidewall portion 30 and the second sealing element 76 may be disposed between and sealingly engaged with the bottom surface 34 of the sidewall portion 30 and the top surface 48 of the housing support plate 26. During assembly of the semiconductor module 20, the first fastening devices 44 may be used to tighten or otherwise secure the cover member 24 to the housing 22 and the housing 22 to the housing support plate 26. As a result, the first and second sealing elements 74, 76 may compress to form a protective seal between the cover member 24, the housing 22, and the housing support plate 26. In one non-limiting example, the protective seal may be a substantially fluid tight seal, a fluid being a gas, a liquid, or other free-flowing substance. Furthermore, the protective seal may be configured to keep out dust, particles, and other contaminants which may be suspended in the fluid surrounding the semiconductor module 20. Additionally, the first and second sealing elements 74, 76 may be combined with other methods, such as potting or encapsulating the semiconductor device 52 and semiconductor module components 54 with a silicone or other conformable material (not shown), to provide protection against fluid, dust, particles, and other forms of environmental contaminants. Moreover, in some embodiments, the potting or encapsulating material may completely or partially fill in the unoccupied space within the interior space 56 of the semiconductor module 20, and as a result it may provide further protection against vibration, mechanical shock, and other physical forces. Furthermore, the potting and encapsulation material may help regulate the temperature of the semiconductor module 20 by providing a pathway for heat generated by the semiconductor device 52 and semiconductor module components 54 and conduct the heat towards the sidewall portion 30 of the housing 22.

Figure 5:
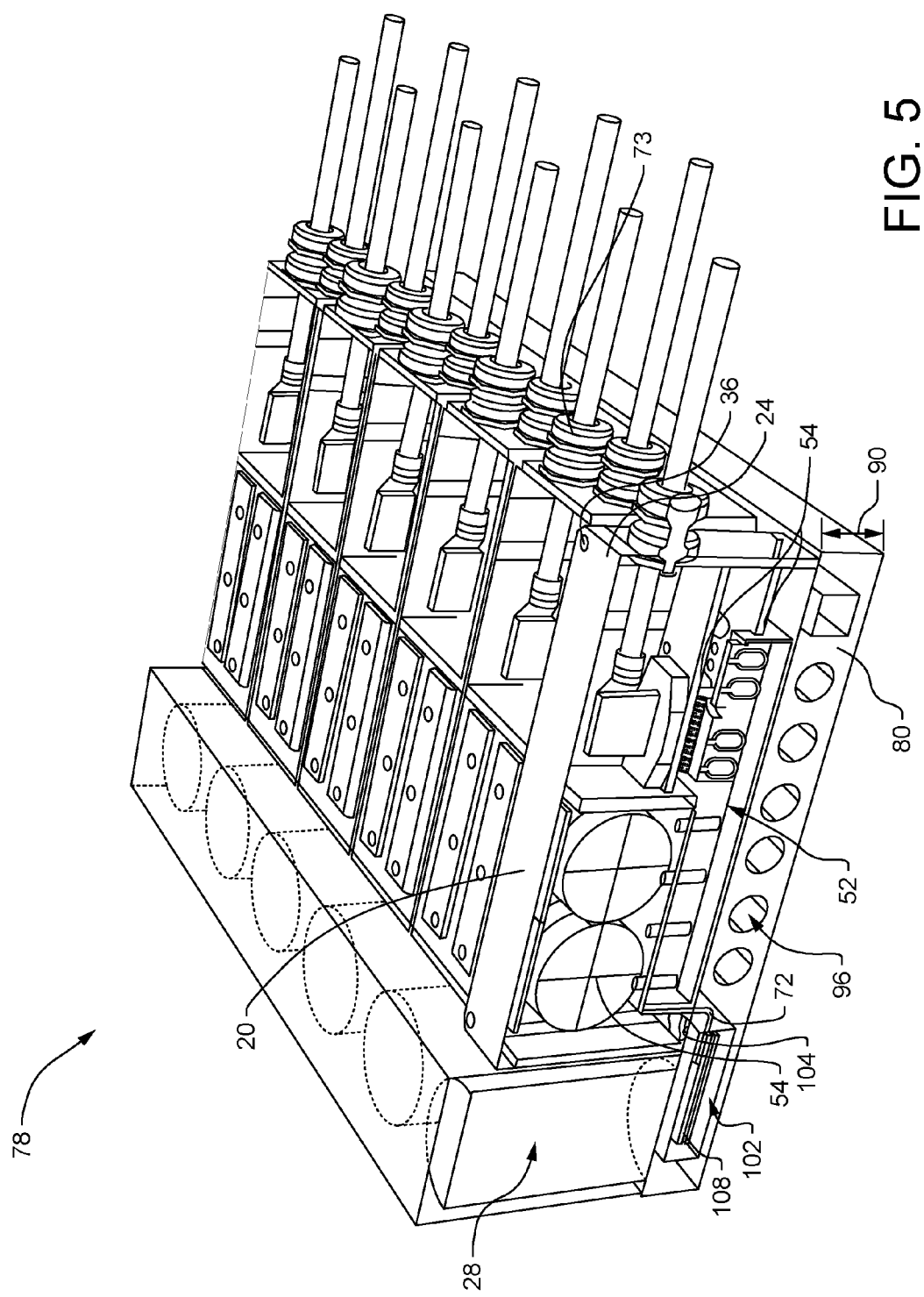
FIG. 5 is a cross-sectional view of the semiconductor module of FIG. 1, and a perspective view of a power converter system, in accordance with one embodiment of the present disclosure.
Figure 6:
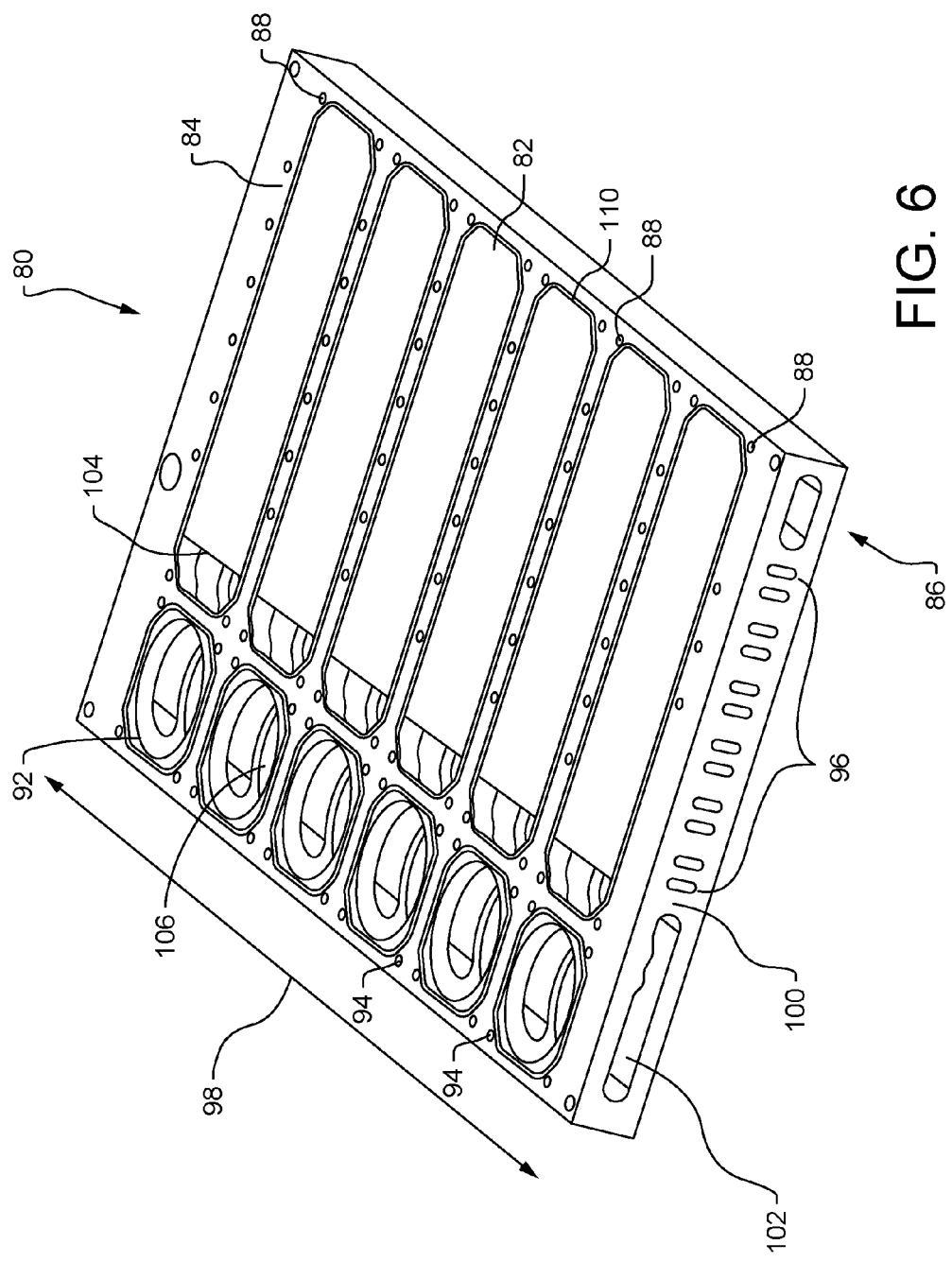
FIG. 6 is a perspective view of the semiconductor module heat sink of FIG. 5 positioned, in accordance with one embodiment of the present disclosure.

Referring now to FIG. 5, a perspective view of an embodiment of a power converter system 78 which incorporates a plurality of semiconductor modules 20 is shown. In some embodiments, the power converter system 78 may include a semiconductor module heat sink 80 or similar type of mounting plate. As illustrated in FIG. 6, in one embodiment, the semiconductor module heat sink 80 may be configured with six semiconductor module mounting locations 82, along with six auxiliary mounting locations 92, that are defined on a top surface 84 of the semiconductor module heat sink 80, however other arrangements and numbers of semiconductor module mounting locations 82 and auxiliary mounting locations 92 are possible. For example, the semiconductor module heat sink 80 may be sized to accommodate a fewer or greater number of semiconductor module mounting locations 82 arranged along the top surface 84. Additionally, or alternatively, the semiconductor module heat sink 80 may be configured with semiconductor module mounting locations 82 on both the top surface 84 and the bottom surface 86 of the semiconductor module heat sink 80.

As further illustrated in FIG. 6, one embodiment of the semiconductor module heat sink 80 may include a set of module mounting holes 88 arranged around each of the semiconductor module mounting locations 82. Note, the set of module mounting holes 88 are similar to the third set of holes 46 illustrated in FIG. 2. A semiconductor module 20 may be positioned at each of the semiconductor module mounting locations 82 and fixedly attached to the semiconductor module heat sink 80 using a plurality of first fastening devices 44 (as shown in FIGS. 2,3, and 5). Furthermore, the plurality of first fastening devices 44 may be inserted into a first set of holes 36 formed in the cover member 24, and a second set of holes 42 formed in the sidewall portion 30 of the housing 22 of the semiconductor module 20 (as shown in FIGS. 2-3). Moreover, the first set of holes 36 and the second set of holes 42 from each semiconductor module 20 may be aligned with the set of module mounting holes 88 arranged around each of the semiconductor module mounting locations 82. In some embodiments, the set of module mounting holes 88 may be formed through a portion of the thickness 90 (shown in FIG. 5) of the semiconductor module heat sink 80. Alternatively, the set of module mounting holes 88 may be formed through an entirety of the thickness 90 of the semiconductor module heat sink 80. Furthermore, the set of module mounting holes 88 may include threads (not shown), or other fastening components, which are paired with the first set of fastening devices 44 in order to fixedly attach the plurality of semiconductor modules 20 to the semiconductor module heat sink 80.

The semiconductor module heat sink 80 may also include a plurality of auxiliary component mounting locations 92 arranged on the top surface 84 and configured for fixedly attaching a plurality of auxiliary components 28 to the semiconductor module heat sink 80. The auxiliary components 28 may be components such as capacitors, resistors, power export devices or other known components and the auxiliary components 28 may be paired with the semiconductor modules 20 and configured to provide electrical noise filtration, a priming power supply, an indicator lamp driver, a ground fault detection device, and/or other such functions of the power converter system 78. The auxiliary component mounting locations 92 may have a set of auxiliary component attachment holes 94 which may be configured similarly to the set of module mounting location holes 88 and used to fixedly attach the auxiliary components 28 to the semiconductor module heat sink 80. As a result, a plurality of first fastening devices 44, or similar device, may be paired with the auxiliary component attachment holes 94 to attach the auxiliary components 28 to the semiconductor module heat sink 80.

In one non-limiting example, the semiconductor module heat sink 80 may be used to help regulate the temperature of the power converter system 78. During operation of the power converter system 78, the semiconductor modules 20 and auxiliary components 28 may generate heat or other thermal energy. As a result, a temperature regulation mechanism may be incorporated with the power converter system 78 to maintain a specified operation temperature range for the semiconductor modules 20, the auxiliary components 28, and other components (e.g. components of the power converter system 78). In one non-limiting example the specified operation temperature rage may be between −40° C. and +150° C., however other temperature ranges are possible. In some embodiments, a plurality of cooling channels 96 may be formed within and configured to run a length 98 of the semiconductor module heat sink 80. Moreover, the cooling channels 96 may be utilized to circulate a gas, a liquid, or other temperature regulating medium to through the cooling channels 96 to help keep the semiconductor modules 20 and auxiliary components 28 within a specified operational temperature range, such as but not limited to between −40° C. and +150° C. For example, the semiconductor module heat sink 80 may be fabricated from aluminum alloy, copper alloy, or other known thermally conductive material and an extrusion process or other known process may be used to form and arrange the cooling channels 96 within an interior portion 100 of the semiconductor module heat sink 80. In some embodiments, the cooling channels 96 may be further arranged to avoid intersecting or otherwise interfering with the set of module mounting holes 88 in the top surface 84 of the semiconductor module heat sink 80.

In some embodiments, as further illustrated in FIG. 5, the semiconductor module heat sink 80 may be further include an internal channel 102 that is formed within the interior portion 100 and runs the length 98 of the semiconductor module heat sink 80. Furthermore, the semiconductor module heat sink 80 may have a plurality of semiconductor module mounting location apertures 104 and a plurality of auxiliary mounting location apertures 106. The internal channel 102 may be aligned with the semiconductor mounting location apertures 104 and, the auxiliary semiconductor module mounting location apertures 106. In one non-limiting example, the semiconductor mounting location apertures 104 and the auxiliary semiconductor module mounting location apertures 106 extend a specified depth from the top surface 84 into the interior portion 100 of the semiconductor module heat sink 100 and the semiconductor mounting location apertures 104, and the auxiliary semiconductor mounting location apertures 106 open into the internal channel 102. As a result, the semiconductor mounting location apertures 104, and the auxiliary semiconductor module mounting location apertures 106 may define a communication pathway between each of the semiconductor module mounting locations 82, the auxiliary component mounting locations 92, and the internal channel 102. The internal channel 102 may be utilized to contain, a conductor 108, such as an interstitial busbar, or other such electrical distribution pathway, power distribution pathway, and/or data distribution pathway. As a result, each semiconductor mounting location aperture 104 and each auxiliary mounting location aperture 106 may provide a communication pathway between the conductor 108 and each of the semiconductor modules 20 and the auxiliary components 28. Furthermore, the semiconductor modules 20 and the auxiliary components 28 may be coupled to or otherwise connected to the conductor 108 within the internal channel 102.

As illustrated in FIG. 5, the semiconductor module 20 may include the first semiconductor module input/output connection 72 and the second semiconductor module input/output connections 73. When each of the semiconductor modules 20 are positioned at the semiconductor module mounting locations 82 (as shown in FIG. 6), the semiconductor module input/output connection 72 may align with and extend through the semiconductor module mounting location aperture 104. In some embodiments, each of the semiconductor module input/output connections 72 may be communicably coupled with the conductor 108 positioned within the internal channel 102. In one non-limiting example, the conductor 108 may be configured to carry electricity, a data signal, or other input which is distributed to each of the semiconductor modules 20. Alternatively, in some embodiments, the conductor 108 may be configured to receive electricity, a data signal or other output produced by each of the semiconductor modules 20. Furthermore, each of the auxiliary components 28 (shown in FIG. 5) may have an input/output connection (not shown) which is configured similarly to the semiconductor module input/output connection 72, and extends through the auxiliary mounting location aperture 106 (FIG. 6) and is coupled with the conductor 108.

As illustrated in FIG. 6, the semiconductor module mounting location aperture 104 may be formed such that each of the semiconductor modules 20 are capable of maintaining a substantially fluid and particulate tight seal around a periphery 110 of each of the semiconductor module mounting locations 82. In some embodiments, a sealing surface 110, such as a groove, a flange, or other surface, may be formed or otherwise defined around a periphery of the semiconductor module mounting locations 82. The sealing surface 110 may be capable of mating with the second sealing element 76 (as illustrated in FIG. 3), to form a substantially fluid tight seal. In one non-limiting example, the second sealing element 76 may be an o-ring, a PIP seal, a silicone gasket, or other known type of sealing element. Moreover, in some embodiments, it may be desirable for the second sealing element 76 and the sealing surface 110 to form a continuous seal around each of the semiconductor module mounting locations 82 between the housing 22 and the top surface 84 of the semiconductor module heat sink 80. In one non-limiting example, the continuous seal may be maintained by containing the semiconductor module mounting location aperture 104 within the sealing surface 110. As a result, the second sealing element 76 of each semiconductor module 20 may be able to form a continuous seal around the sealing surface 110 and the semiconductor module input/output connection 72 may be able to extend through the semiconductor mounting location aperture 104 and couple or otherwise connect with the conductor 108 while maintaining a substantially fluid and particulate tight seal. Additionally, as described above, the first and second sealing elements 74, 76 of each semiconductor module 20 may be combined with other methods, such as potting or encapsulating each of the semiconductor devices 52 and semiconductor module components 54 with a silicone or other conformable material (not shown), to provide protection against fluids, particles, and other forms of environmental contaminants. Moreover, in some embodiments, the potting or encapsulating material may completely or partially fill in the unoccupied space within the interior space 56 of each semiconductor module 20, and as a result it may provide further protection against vibration, mechanical shock, and other physical forces. Furthermore, the potting and encapsulation material may help regulate the temperature of each semiconductor module 20 by providing a pathway for heat generated by the semiconductor devices 52 and semiconductor module components 54, and may help conduct the heat towards the sidewall portion 30 of the housing 22 of each semiconductor module 20.

INDUSTRIAL APPLICABILITY

In general, the foregoing disclosure finds utility in various industrial applications, such as in transportation, mining, construction, industrial, earthmoving, agricultural, and forestry machines and equipment. In particular, the disclosed semiconductor module and power converter system may be applied to hauling machines, dump trucks, mining vehicles, on-highway vehicles, trains, motor graders, loaders, excavators, earth-moving vehicles, dozers, tractors, backhoes, agricultural equipment, material handling equipment, power generators, and the like.

For example, the power converter system 78, including a plurality of semiconductor modules 20, may be subjected to heavy use during operation and as a result, one or more of the semiconductor modules 20 may require unscheduled service or maintenance. Depending upon where the machine or equipment containing the power converter system 78 is deployed, the semiconductor modules 20 may need to be serviced or replaced in the field or job site rather than at a maintenance facility. During repair, the worn out semiconductor module 20 may be removably uncoupled from the semiconductor module heat sink 80 by loosening or otherwise removing the plurality of first fastening devices 44. The worn out semiconductor module 20 may then be removed from the semiconductor module heat sink 80 and either be repaired or replaced with an operational semiconductor module 20. The repaired or operational semiconductor module 20 may be fixedly attached to the semiconductor module heat sink 80 aligning the first and second set of holes 36, 42 with the set of module mounting holes 88. Furthermore, the first fastening device 44 may be inserted into each of the aligned first set of holes 36, the second set of holes 42 and set of module mounting holes 88 and tightened or otherwise secured such that each of the tightened first fastening devices 44 ensures the semiconductor module 20 is properly and securely attached to the semiconductor module heat sink 80.

This may be contrasted by the common practice which follows a complex attachment method for securing the semiconductor device 52, the housing 22 and the cover member 24 to the semiconductor module heat sink 80. The complex attachment method may require a specific tightening method, such as but not limited to, adhering to a specific torque pattern when securing and attaching the semiconductor device 52, the housing 22 and the cover member 24 to the semiconductor module heat sink 80. Failure to adhere to the specific torque pattern may result in damage or failure of the newly replaced semiconductor device 52. Moreover, such a labor intensive practice may make it increasingly difficult to make the necessary repairs to the power converter system 78 while out in the field, therefore extending the downtime of the machine or equipment.

As such, some embodiments of the semiconductor module 20 of the present disclosure may incorporate a plurality of one or more attachment structures 58 with the sidewall portion 30 of the housing 22. The one or more attachment structures 58 may be configured in a way that minimizes or altogether eliminates the need for a complex method for attaching the semiconductor device 52 to the semiconductor module heat sink 80. In one non-limiting example, the one or more attachment structures 58 may be formed with a first set of attachment holes 62 which correspond to a second set of attachment holes 64 formed in the semiconductor device 52. A second fastening device 66 is inserted into each of the first and second set of attachment holes 62, 64 to secure the semiconductor device 52 to the housing 22. Moreover, when the housing 22 and cover member 24 are fixedly attached to the semiconductor module heat sink 80, the semiconductor device 52 is positioned by the one or more attachment structures 58 to properly contact the top surface 84 of the semiconductor module heat sink 80.

Additionally, in some embodiments, the second fastening devices 66 may be sized such that they do not need to extend through the entire height 67 of the housing 22. As a result, this may increase the available interior space 56 such that the housing 22 may be able to accommodate additional semiconductor module components 54. In some embodiments the semiconductor module components 54 may be positioned above the semiconductor device 52. However other configurations are possible. Furthermore, the semiconductor module 20 may provide a protective enclosure which is capable of protecting and isolating the semiconductor device 52 and semiconductor module components 54 from vibration, moisture, dust, conductive particles, and other damaging environmental elements. Additionally, in order to maintain the protective enclosure, some embodiments of the semiconductor module 20 may incorporate a semiconductor mounting location aperture 104 formed at each semiconductor module mounting location 82 and a semiconductor module input/output connection 72 may be fed through the semiconductor mounting location aperture 104. As a result, electricity and other signals may be input and/or output from each of the semiconductor modules 20 without compromising the protective environment provided by the semiconductor module 20.

While the foregoing detailed description has been given and provided with respect to certain specific embodiments, it is to be understood that the scope of the disclosure should not be limited to such embodiments, but that the same are provided simply for enablement and best mode purposes. The breadth and spirit of the present disclosure is broader than the embodiments specifically disclosed and encompassed within the claims appended hereto. Moreover, while some features are described in conjunction with certain specific embodiments, these features are not limited to use with only the embodiment with which they are described, but instead may be used together with or separate from, other features disclosed in conjunction with alternate embodiments.

What is claimed is:

1. A semiconductor module, comprising:
   a housing having a sidewall portion;
   a housing support plate coupled to a bottom surface of the sidewall portion, the housing support plate and the sidewall portion defining an interior space of the housing of the semiconductor module;
   a semiconductor device disposed within the interior space and fixedly coupled to the housing; and
   a cover member fixedly attached to a top surface of the sidewall portion, such that the cover member, the housing, and the housing support plate form a protective enclosure for the semiconductor device,
   wherein:
   the cover member includes a first set of holes extending from a top surface of the cover member to a bottom surface of the cover member,
   the housing includes a second set of holes extending from the top surface of the sidewall portion to the bottom surface of the sidewall portion,
   the housing support plate includes a third set of holes formed in a top surface of the housing support plate, and
   the first set of holes, the second set of holes and the third set of holes are aligned such that a fastening device being inserted into each of the first set of holes, the second set of holes, and the third set of holes fixedly attaches the cover member, the housing, and the housing support plate together.

2. The semiconductor module of claim 1, further comprising a plurality of attachment structures integrated with the sidewall portion,
   wherein the plurality of attachment structures include a first set of attachment holes and the semiconductor device includes a second set of attachment holes,
   the first set of attachment holes aligning with the second set of attachment holes such that a fastening device, inserted into each of the first and second set of attachment holes, secures the semiconductor device between the plurality of attachment structures and the housing support plate.

3. The semiconductor module of claim 2, wherein the fastening device is a pressure fastening device which exerts a pressure on the semiconductor device such that a bottom surface of the semiconductor device maintains contact with a top surface of the housing support plate.

4. The semiconductor module of claim 1, wherein a first sealing element is disposed between the bottom surface of the cover member and the top surface of the sidewall portion thereby forming a first seal between the cover member and the sidewall portion, and
   wherein a second sealing element is disposed between the bottom surface of the sidewall portion and the top surface of the housing support plate thereby forming a second seal between the sidewall portion and the housing support plate.

5. The semiconductor module of claim 4, wherein the housing support plate includes a housing support plate aperture extending from the top surface of the housing support plate through a bottom surface of the housing support plate, and
   wherein the housing support plate aperture is contained within a sealing element groove formed around a periphery of the housing support plate, such that the second seal is maintained and a semiconductor module input/output connection passes from the interior space of the housing to an exterior space of the semiconductor module.

6. The semiconductor module of claim 1, wherein the interior space of the housing is configured to accommodate a plurality of semiconductor module components arranged above the semiconductor device.

7. The semiconductor module of claim 6, wherein the sidewall portion includes a sidewall aperture extending from the interior space of the housing to an exterior space of the housing, and
   wherein the plurality of semiconductor module components have an input/output connection extending through the sidewall aperture.

8. A power converter system, comprising:
   a plurality of semiconductor modules,
   each semiconductor module, of the plurality of semiconductor modules, including a housing and a semiconductor device,
   the housing, of each semiconductor module of the plurality of semiconductor modules, having a sidewall portion which includes a top surface and a bottom surface;
   a semiconductor module heat sink having a plurality of module mounting locations arranged on a top surface of the semiconductor module heat sink,
   each semiconductor module, of the plurality of semiconductor modules, being positioned at one of the plurality of module mounting locations and coupled to the semiconductor module heat sink along the bottom surface of the sidewall portion, the sidewall portion of each semiconductor module of the plurality of semiconductor modules, and the top surface of the semiconductor module heat sink defining an interior space of each semiconductor module of the plurality of semiconductor modules;

a plurality of attachment structures integrated with the sidewall portion of each semiconductor module, of the plurality of semiconductor modules, and adapted to secure the semiconductor device, of each semiconductor module, within the interior space of the semiconductor module; and a cover member attached to the top surface of the sidewall portion, of the semiconductor module, such that the cover member, the housing of the semiconductor module, and the semiconductor module heat sink form a protective enclosure for the semiconductor device of the semiconductor module.

9. The power converter system of claim 8, wherein:
the cover member, of the semiconductor module, includes a first set of holes extending from a top surface of the cover member to a bottom surface of the cover member,
the housing, of the semiconductor module, includes a second set of holes extending from the top surface of the sidewall portion, of the semiconductor module, to the bottom surface of the sidewall portion,
each module mounting location, of the plurality of module mounting locations, includes a third set of holes formed in the top surface of the semiconductor module heat sink, and
the first set of holes, the second set of holes, and the third set of holes are aligned such that a fastening device being inserted into each of the first set of holes, the second set of holes and the third set of holes fixedly attaches the cover member, the housing and the semiconductor module heat sink together.

10. The power converter system of claim 9, wherein a first sealing element is disposed between the bottom surface of the cover member and the top surface of the sidewall portion, thereby forming a first seal between the cover member and the sidewall portion, and
wherein a second sealing element is disposed between the bottom surface of the sidewall portion and the top surface of the semiconductor module heat sink thereby forming a second seal between the housing and the semiconductor module heat sink.

11. The power converter system of claim 8, wherein:
the plurality of attachment structures include a first set of attachment holes,
the semiconductor device, of the semiconductor module, includes a second set of attachment holes, and
the first set of attachment holes align with the second set of attachment holes such that a fastening device, inserted into each of the first set of attachment holes and the second set of attachment holes, positions and secures the semiconductor device between the plurality of attachment structures and the semiconductor module heat sink.

12. The power converter system of claim 11, wherein the fastening device is a pressure fastening device which exerts a pressure on the semiconductor device, of the semiconductor module, such that a bottom surface of the semiconductor device maintains contact with the top surface of the semiconductor module heat sink.

13. The power converter system of claim 8, wherein the interior space of the housing, of the semiconductor module, is configured to accommodate a plurality of semiconductor module components arranged within the housing and positioned above the semiconductor device, of the semiconductor module.

14. The power converter system of claim 13, wherein the sidewall portion, of the semiconductor module, includes a sidewall aperture extending from the interior space of the semiconductor module to an exterior space of the semiconductor module, and
wherein the plurality of semiconductor module components have an input/output connection extending through the sidewall aperture.

15. The power converter system of claim 8, wherein the semiconductor module heat sink includes a plurality of auxiliary mounting locations to accommodate a plurality of power converter system auxiliary components.

16. The power converter system of claim 15, further comprising an internal channel formed within the semiconductor module heat sink,
wherein;
the internal channel is configured to run along a length of the semiconductor module heat sink,
each of the plurality of module mounting locations each having a module aperture contained within a sealing element groove formed around a periphery of each of the plurality of module mounting locations,
the plurality of auxiliary mounting locations each having an auxiliary aperture, and
each of the module apertures and the auxiliary apertures extending through the top surface of the semiconductor module heat sink into the internal channel.

17. The power converter system of claim 16, wherein:
the internal channel is configured with a conductor,
each of the plurality of semiconductor modules includes an input/output connection, and
the plurality of semiconductor modules being coupled to the conductor through the input/output connection extending into the internal channel through each of the module apertures.

18. A power converter system, comprising:
a plurality of semiconductor modules,
each semiconductor module, of the plurality of semiconductor modules, including a housing, a semiconductor device, and a cover member,
the housing, of each semiconductor module of the plurality of semiconductor modules, having a sidewall portion with a top surface and a bottom surface;
a semiconductor module heat sink having a plurality of module mounting locations and a plurality of auxiliary mounting locations arranged on a top surface of the semiconductor module heat sink,
the bottom surface of the sidewall portion, of each semiconductor module of the plurality of semiconductor modules, being positioned at one of the plurality of module mounting locations, and
the top surface of the semiconductor module heat sink and the sidewall portion, of each semiconductor module of the plurality of semiconductor modules, defining an interior space of each semiconductor module of the plurality of semiconductor modules;
a plurality of attachment structures integrated with the sidewall portion of each semiconductor module, of the plurality of semiconductor modules,
the plurality of attachment structures, of each semiconductor module of the plurality of semiconductor modules, including a first set of attachment holes, the semiconductor device, of each semiconductor module, of the plurality of semiconductor modules, including a second set of attachment holes, and the first set of attachment holes aligning with the second set of attachment holes such that a pressure fastening device, inserted into each of the first set of attachment holes and the second set of attachment holes, exerts a pressure on the semiconductor device such that:

a bottom surface of the semiconductor device maintains contact with the top surface of the semiconductor module heat sink, and the semiconductor device, of each semiconductor module of the plurality of semiconductor modules, is secured between the plurality of attachment structures and the top surface of the semiconductor module heat sink;

a first set of holes being formed in the cover member, of each of the plurality of semiconductor modules, the first set of holes extending from a top surface of the cover member to a bottom surface of the cover member;

a second set of holes being formed in the housing, of each of the plurality of semiconductor modules, the second set of holes extending from the top surface of the sidewall portion to the bottom surface of the sidewall portion;

a third set of holes formed in the top surface of the semiconductor module heat sink, the third set of holes being arranged around each of the plurality of module mounting locations, and the first set of holes, the second set of holes, and the third set of holes being aligned such that a fastening device fixedly attaches the cover member, the housing, and the semiconductor module heat sink together, the fastening device being inserted into each of the first set of holes, the second set of holes and the third set of holes.

19. The power converter system of claim 18, wherein a first sealing element is disposed between the bottom surface of the cover member and the top surface of the sidewall portion, of each semiconductor module, of the plurality of semiconductor modules, thereby forming a first seal between the cover member and the sidewall portion of each semiconductor module, wherein a second sealing element is disposed between the bottom surface of the sidewall portion of each semiconductor module, of the plurality of semiconductor modules, and the top surface of the semiconductor module heat sink thereby forming a second seal between the housing, of each semiconductor module, of the plurality of semiconductor modules, and the semiconductor module heat sink, wherein the semiconductor module heat sink includes an internal channel formed within the semiconductor module heat sink, the internal channel is configured to run along a length of the semiconductor module heat sink, each of the plurality of module mounting locations each having a module aperture contained within a sealing element groove formed around the periphery of each of the plurality of module mounting locations, the plurality of auxiliary mounting locations each having an auxiliary aperture, each of the module apertures and the auxiliary apertures extending through the top surface of the semiconductor module heat sink and into the internal channel, and the internal channel being configured with a conductor, the plurality of semiconductor modules having an input/output connection, and the plurality of semiconductor modules being coupled to the conductor through the input/output connection extending into the internal channel through each of the module apertures.

\* \* \* \* \*